(12) United States Patent
Zhang et al.

(10) Patent No.: US 12,278,210 B2
(45) Date of Patent: Apr. 15, 2025

(54) MANUFACTURING METHOD OF SEMICONDUCTOR STRUCTURE

(71) Applicant: United Microelectronics Corp., Hsinchu (TW)

(72) Inventors: Sheng Zhang, Singapore (SG); Kai Zhu, Singapore (SG); Chien-Kee Pang, Singapore (SG); Chia-Liang Liao, Yunlin County (TW)

(73) Assignee: United Microelectronics Corp., Hsinchu (TW)

( * ) Notice: Subject to any disclaimer, the term of this patent is extended or adjusted under 35 U.S.C. 154(b) by 437 days.

(21) Appl. No.: 17/883,595

(22) Filed: Aug. 8, 2022

(65) Prior Publication Data

US 2023/0411343 A1    Dec. 21, 2023

(30) Foreign Application Priority Data

Jun. 21, 2022   (TW) ................... 111122949

(51) Int. Cl.
| | | |
|---|---|---|
| *H01L 21/00* | (2006.01) | |
| *H01L 21/02* | (2006.01) | |
| *H01L 23/00* | (2006.01) | |

(52) U.S. Cl.
CPC ........ *H01L 24/80* (2013.01); *H01L 21/02337* (2013.01); *H01L 2224/80895* (2013.01); *H01L 2224/80896* (2013.01)

(58) Field of Classification Search
CPC ............ H01L 24/80; H01L 21/02337; H01L 2224/80895; H01L 2224/80896; H01L 23/49827; H01L 2224/32145; H01L 2225/06541; H01L 2224/16145; H01L 25/0753; H01L 2224/0603; H01L 24/06; H01L 21/76877; H01L 2224/16237; H01L 2224/08146; H01L 2224/80001; H01L 2224/0558; H01L 2224/05009;
(Continued)

(56) References Cited

U.S. PATENT DOCUMENTS

| 5,139,971 A | 8/1992 | Giridhar et al. |
|---|---|---|
| 5,786,278 A | 7/1998 | Fry |

(Continued)

FOREIGN PATENT DOCUMENTS

TW    201715620 A   *   5/2017   ........... H01L 21/187

OTHER PUBLICATIONS

"Office Action of Taiwan Counterpart Application", issued on Oct. 14, 2024, p. 1-p. 5.

*Primary Examiner* — Niki H Nguyen
(74) *Attorney, Agent, or Firm* — JCIPRNET

(57) ABSTRACT

Provided is a manufacturing method of a semiconductor structure. The manufacturing method includes the following steps. A first dielectric layer is formed on a first substrate. A second dielectric layer is formed on a second substrate. A first heat treatment is performed on the first dielectric layer and the second dielectric layer, wherein a temperature of the first heat treatment is between 300° C. and 400° C. A first conductive via is formed in the first dielectric layer. A second conductive via is formed in the second dielectric layer. The first substrate and the second substrate are bonded in a manner that the first dielectric layer faces the second dielectric layer, so as to connect the first conductive via and the second conductive via.

12 Claims, 7 Drawing Sheets

(58) Field of Classification Search
CPC ... H01L 2223/6616; H01L 2224/80203; H01L 2924/19104; H01L 2224/83856; H01L 23/295; H01L 2224/0508; H01L 21/76804; H01L 21/304; H01L 21/76251; H01L 2224/81894; H01L 21/76864; H01L 2224/16501; H01L 2224/85203; H01L 2224/81205; H01L 2224/24145; H01L 21/187; H01L 21/76811; H01L 2224/81201; H01L 2224/1358; H01L 2224/32221

See application file for complete search history.

(56) References Cited

U.S. PATENT DOCUMENTS

| | | |
|---|---|---|
| 6,194,304 B1 | 2/2001 | Morozumi et al. |
| 6,358,789 B2 | 3/2002 | Lee |
| 6,391,777 B1 | 5/2002 | Chen et al. |
| 6,716,740 B2 | 4/2004 | Wang et al. |
| 8,501,537 B2 | 8/2013 | Sadaka et al. |
| 8,860,229 B1 * | 10/2014 | Lin .................. H01L 21/76897 |
| | | 257/774 |
| 10,062,943 B2 | 8/2018 | Li |
| 10,109,474 B1 | 10/2018 | Wang et al. |
| 10,153,342 B1 | 12/2018 | He et al. |
| 10,262,986 B2 | 4/2019 | Dai et al. |
| 10,460,980 B2 | 10/2019 | Verma et al. |
| 2015/0021785 A1 * | 1/2015 | Lin .................. H01L 21/76897 |
| | | 438/459 |
| 2021/0151353 A1 * | 5/2021 | Kuang .............. H01L 21/76805 |
| 2021/0257340 A1 * | 8/2021 | Chen ...................... H01L 24/09 |

\* cited by examiner

MANUFACTURING METHOD OF SEMICONDUCTOR STRUCTURE

CROSS-REFERENCE TO RELATED APPLICATION

This application claims the priority benefit of Taiwan application serial no. 111122949, filed on Jun. 21, 2022. The entirety of the above-mentioned patent application is hereby incorporated by reference herein and made a part of this specification.

BACKGROUND

Technical Field

The present invention relates to a manufacturing method of a semiconductor structure, and particularly to a manufacturing method of a semiconductor structure which may avoid warpage of a dielectric layer.

Description of Related Art

In the current semiconductor process, in order to bond and electrically connect two wafers, a conductive via is usually formed in the uppermost dielectric layer on the wafer, and then the conductive vias on the two wafers are connected to each other. However, the dielectric layer formed by the chemical vapor deposition (CVD) process is subjected to warpage due to stress. As a result, the position of the conductive via formed in the dielectric layer may be offset, so that the alignment degree between the conductive vias on the two wafers is reduced when bonding the two wafers, and thus the electrical properties of the formed semiconductor structure are severely affected.

SUMMARY

The present invention provides a manufacturing method of a semiconductor structure, wherein a heat treatment is performed on a dielectric layer at a temperature between 300° C. and 400° C., thereby effectively improving the stability of the dielectric layer.

A manufacturing method of a semiconductor structure includes the following steps. A first dielectric layer is formed on a first substrate. A second dielectric layer is formed on a second substrate. A first heat treatment is performed on the first dielectric layer and the second dielectric layer, wherein a temperature of the first heat treatment is between 300° C. and 400° C. A first conductive via is formed in the first dielectric layer. A second conductive via is formed in the second dielectric layer. The first substrate and the second substrate are bonded in a manner that the first dielectric layer faces the second dielectric layer, so as to connect the first conductive via and the second conductive via.

In an embodiment of the manufacturing method of the present invention, the first heat treatment is performed in a nitrogen or oxygen atmosphere.

In an embodiment of the manufacturing method of the present invention, a time of the first heat treatment is between 0.5 hours and 2 hours.

In an embodiment of the manufacturing method of the present invention, the first heat treatment and the second dielectric layer are independently subjected to the first thermal treatment.

In an embodiment of the manufacturing method of the present invention, a thickness of the first dielectric layer is 5000 Å or more.

In an embodiment of the manufacturing method of the present invention, a method for forming the first dielectric layer comprises a plasma enhanced chemical vapor deposition process.

In an embodiment of the manufacturing method of the present invention, a thickness of the second dielectric layer is 5000 Å or more.

In an embodiment of the manufacturing method of the present invention, a method for forming the second dielectric layer comprises a plasma enhanced chemical vapor deposition process.

In an embodiment of the manufacturing method of the present invention, the method further includes forming a cap layer on the first dielectric layer after forming the first dielectric layer, wherein the cap layer exposes a top surface of the first conductive via.

In an embodiment of the manufacturing method of the present invention, the method further includes forming a cap layer on the second dielectric layer after forming the second dielectric layer, wherein the cap layer exposes a top surface of the second conductive via.

In an embodiment of the manufacturing method of the present invention, the method further includes performing a second heat treatment after forming the first conductive via and before bonding the first substrate and the second substrate, wherein a temperature of the second heat treatment is lower than 300° C.

In an embodiment of the manufacturing method of the present invention, the method further includes performing a second heat treatment after forming the second conductive via and before bonding the first substrate and the second substrate, wherein a temperature of the second heat treatment is lower than 300° C.

Based on the above, in the present invention, before forming the conductive via, the dielectric layer is subjected to a heat treatment at a temperature between 300° C. and 400° C. Through the heat treatment, the structure of the dielectric layer may be strengthened to have higher stability. In this way, the dielectric layer may not be warped over time, so that precise alignment between two conductive vias to be connected after bonding two substrates, and the bonding strength between the two substrates may also be improved.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
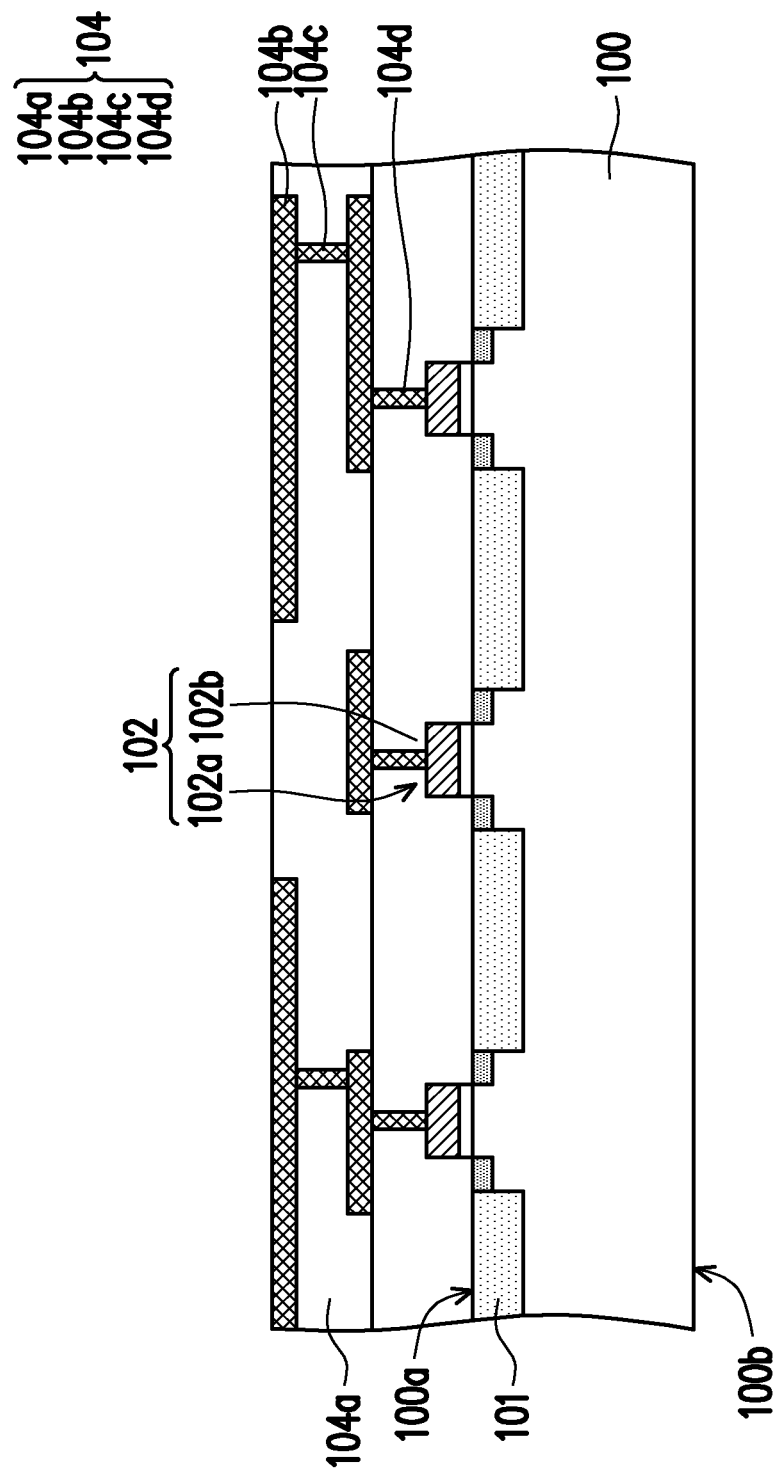
FIGS. 1A to 1G are schematic cross-sectional views illustrating a manufacturing method of a semiconductor structure according to an embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Further, in the text, the range represented by "a value to another value" and "between a value and another value" are summary expression ways to avoid listing all the values in the range one by one in the specification. Therefore, the record of a specific numerical range covers any numerical value within the numerical range, as well as a smaller numerical range defined by any numerical value within the numerical range.

FIGS. 1A to 1G are schematic cross-sectional views illustrating a manufacturing method of a semiconductor structure according to an embodiment of the present invention. Referring to FIG. 1A, a substrate 100 is provided. In the present embodiment, the substrate 100 is, for example, a silicon substrate, but the present invention is not limited thereto. In other embodiments, the substrate 100 may also be a silicon-on-insulator (SOI) substrate. The substrate 100 has a first surface 100a and a second surface 100b opposite to each other. The first surface 100a is a front surface, also called an active surface, on which a semiconductor device may be formed, and the second surface 100b is a back surface. In addition, various well-known semiconductor devices may be formed in and on the substrate 100. For example, in the present embodiment, the isolation structure 101 may be formed in the substrate 100 to define an active area (AA). The isolation structure 101 is, for example, a shallow trench isolation (STI) structure. The forming method of the isolation structure 101 is well known to those skilled in the art, and will not be further described herein.

In addition, a device structure layer 102 may be formed at the first surface 100a of the substrate 100. The device structure layer 102 includes various semiconductor devices well known to those skilled in the art, which is not limited in the present invention. For example, in the present embodiment, the device structure layer 102 includes transistors 102a formed at the active surface, the first surface 101, between the isolation structures 101 and a dielectric layer 102b covering the transistors 102a, but the present invention is not limited thereto.

In addition, an interconnection structure 104 may be formed on the device structure layer 102. In the present embodiment, the interconnection structure 104 includes a dielectric layer 104a, a plurality of circuit layers 104b, a plurality of conductive vias 104c and a plurality of contacts 104d. The dielectric layer 104a is formed on the device structure layer 102. The circuit layers 104b and the conductive vias 104c are formed in the dielectric layer 204a. The conductive vias 104c connect two adjacent layers of the circuit layers 104b. The contacts 104d extend into the device structure layer 102 to connect the transistors 102a and the lowermost circuit layer 104b. In the present embodiment, the interconnection structure 104 includes two layers of circuit layers 104b, but the present invention is not limited thereto. In other embodiments, interconnection structure 104 may include more layers of circuit layer 104b. The detailed configuration and forming method of the interconnection structure 104 are well known to those skilled in the art, and will not be further described herein.

Figure 1B:
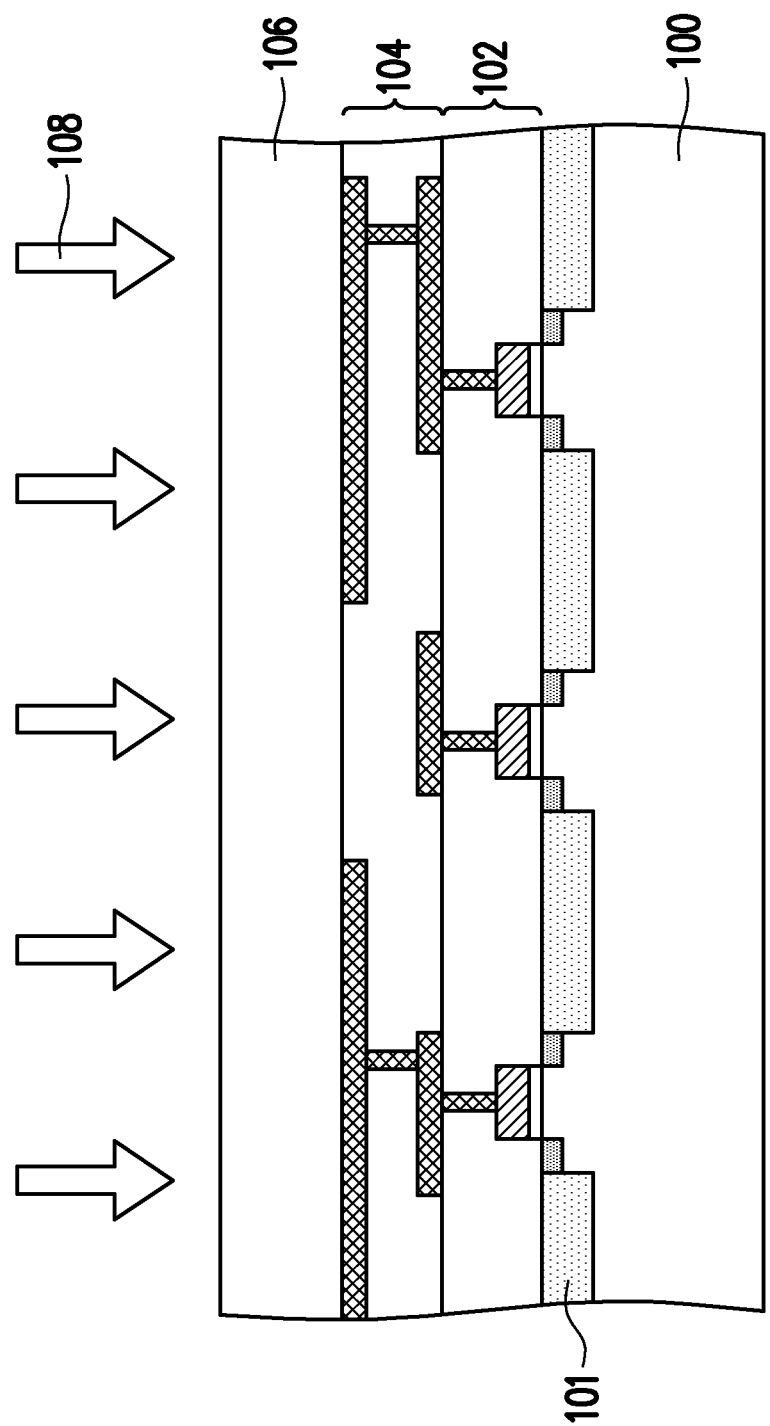

Referring to FIG. 1B, a dielectric layer 106 is formed on the substrate 100. The dielectric layer 106 covers the interconnection structure 104. The dielectric layer 106 may be a tetraethoxysiloxane (TEOS) layer, an undoped silicate glass (USG) layer, a phosphosilicate glass (PSG) layer, an SiCN layer or a combination thereof, but the present invention is not limited thereto. The forming method of the dielectric layer 106 is, for example, a plasma enhanced chemical vapor deposition process. The thickness of the dielectric layer 106 is usually 5000 Å or more. Afterwards, a heat treatment 108 may be performed on the dielectric layer 106 in a nitrogen or oxygen atmosphere. The temperature of the heat treatment 108 is between 300° C. and 400° C. The duration of heat treatment 108 may be between 0.5 hours and 2 hours. Since the process temperature for forming the dielectric layer 106 is generally low, in the present embodiment, the dielectric layer 106 may be strengthened through the heat treatment 108 with a higher temperature, so that the dielectric layer 106 has a more stable structure. In this way, the dielectric layer 106 may not be warped over time, and the components of the dielectric layer 106 may not be easily reacted in subsequent processes.

Figure 1C:
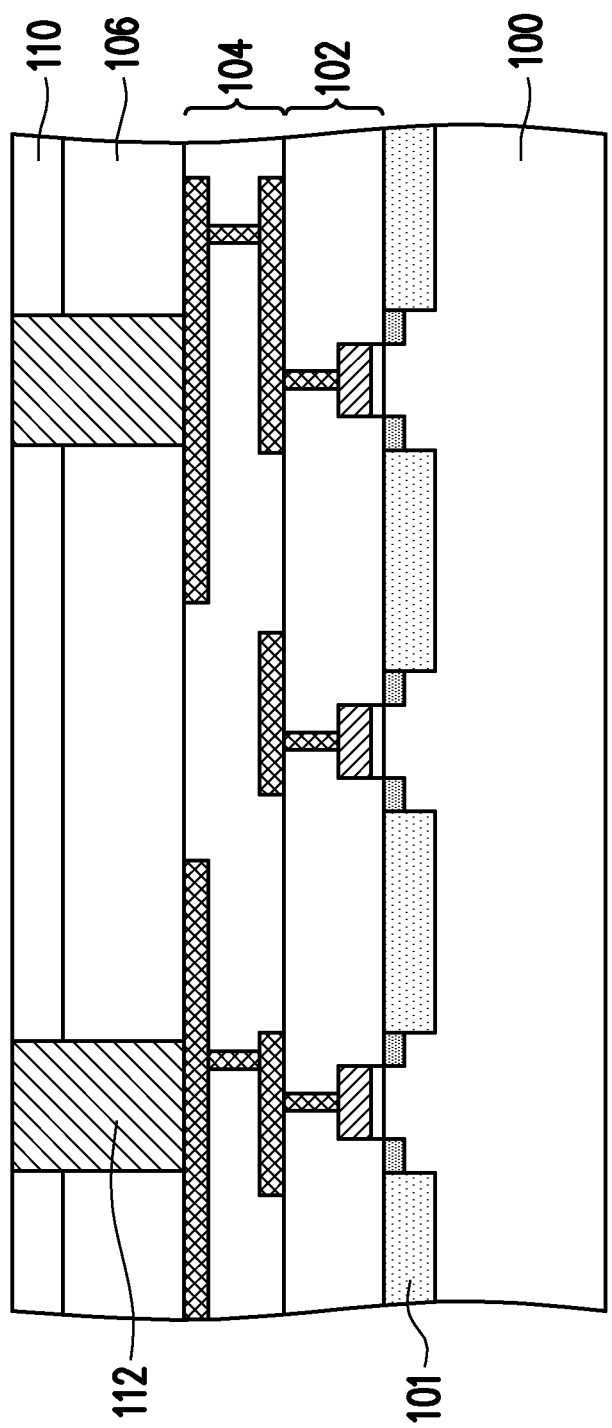

Referring to FIG. 1C, a cap layer 110 may be formed on the dielectric layer 106. In the present embodiment, the cap layer 110 is a silicon nitride layer, but the present invention is not limited thereto. The cap layer 110 is optional, that is, the cap layer 110 may be omitted according to actual needs. After that, conductive vias 112 may be formed in the dielectric layer 106 and the cap layer 110. In the present embodiment, the cap layer 110 exposes the top surfaces of the conductive vias 112. In the present embodiment, the conductive vias 112 are used to enable various devices on the substrate 100 to be electrically connected to external devices or apparatuses, and thus the conductive vias 112 may have a larger size than the conductive vias 104c in the interconnection structure 104. In the present embodiment, the forming method of the conductive vias 112 may include the following steps. First, openings are formed in the conductive layer 106 and the cap layer 110. Next, a conductive material layer is formed on the cap layer 110 and filled the openings. Then, a chemical-mechanical polishing (CMP) process may be performed to remove the conductive material layer outside the opening. After that, a heat treatment may be performed at a temperature of 200° C. for about 20 minutes.

Figure 1D:
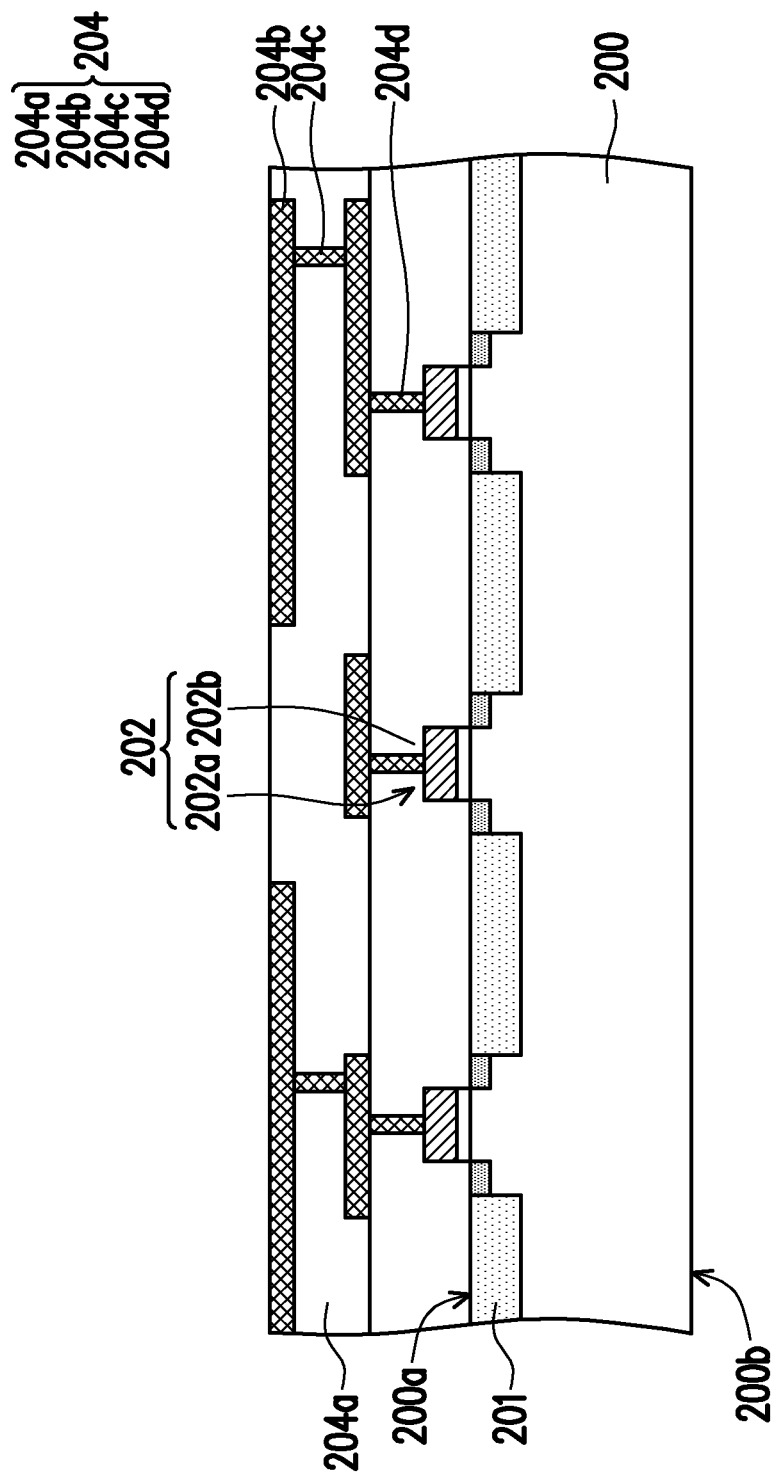

Furthermore, referring to FIG. 1D, a substrate 200 is provided. In the present embodiment, the substrate 200 is, for example, a silicon substrate, but the present invention is not limited thereto. In other embodiments, the substrate 200 may also be a silicon-on-insulator substrate. The substrate 200 has a first surface 200a and a second surface 200b opposite to each other. The first surface 200a is a front surface, also called an active surface, on which a semiconductor device may be formed, and the second surface 200b is a back surface. As in FIG. 1A, the isolation structure 201 may be formed in the substrate 200, the device structure layer 202 including the transistors 202a and the dielectric layer 202b covering the transistors 202a may be formed at the first surface 200b of the substrate 200, and the interconnection structure 204 including the dielectric layer 204a, a plurality of circuit layers 204b, a plurality of conductive vias 204c and a plurality of contacts 204d may be formed on the device structure layer 202. In the present embodiment, the interconnection structure 204 includes two layers of circuit layers 204b, but the present invention is not limited thereto. In other embodiments, interconnection structure 204 may include more layers of circuit layer 204b. In the present embodiment, the configuration on the substrate 200 may be the same or similar to the configuration on the substrate 100, but the present invention is not limited thereto. The configuration on substrate 200 may be different from the configuration on substrate 100 in other embodiments.

Figure 1E:
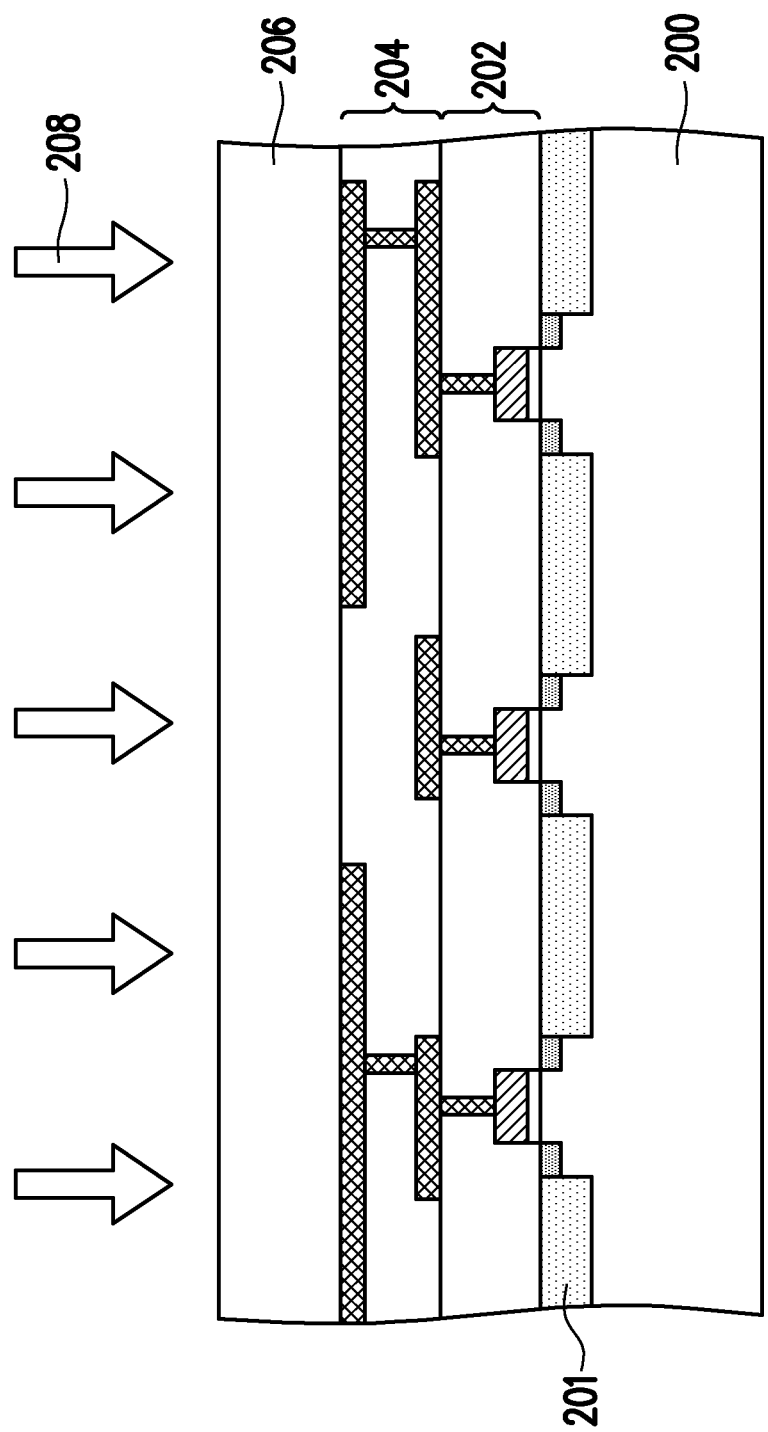

Referring to FIG. 1E, a dielectric layer 206 is formed on the substrate 200. The dielectric layer 206 covers the interconnection structure 204. The dielectric layer 206 may be a tetraethoxysilane layer, an undoped silicate glass layer, a phosphosilicate glass layer, an SiCN layer or a combination thereof, but the present invention is not limited thereto. The forming method of the dielectric layer 206 is, for example, a plasma enhanced chemical vapor deposition process. The thickness of the dielectric layer 206 may be 5000 Å or more. Afterwards, a heat treatment 208 may be performed on the dielectric layer 206 in a nitrogen or oxygen atmosphere. The temperature of the heat treatment 208 is between 300° C. and 400° C. The duration of the heat treatment 208 may be between 0.5 hours and 2 hours. Since the process temperature for forming the dielectric layer 206 is generally low, in the present embodiment, the dielectric layer 206 may be strengthened through the heat treatment 208 with a higher temperature, so that the dielectric layer 206 has a more stable structure. In this way, the dielectric layer 206 may not be warped over time, and the components of the dielectric layer 206 may not be easily reacted in subsequent processes.

In the present embodiment, in different process steps, the dielectric layer 106 and the dielectric layer 206 are respectively subjected to heat treatments at a temperature between 300° C. and 400° C., that is, the dielectric layer 106 and the dielectric layer 206 are independently subjected to a heat treatment, but present invention is not limited thereto. Depending on the actual situation, in other embodiments, the dielectric layer 106 and the dielectric layer 206 may be subjected to a heat treatment at a temperature between 300° C. and 400° C. at the same time.

Figure 1F:
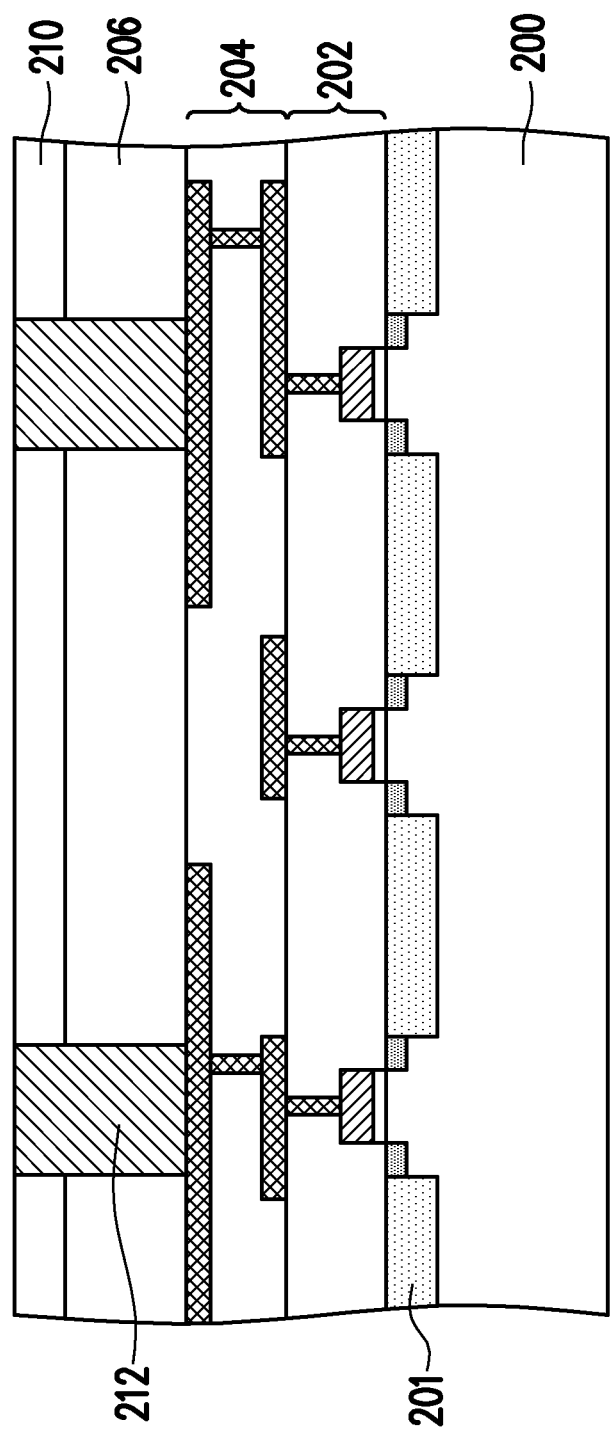

Referring to FIG. 1F, as in FIG. 1C, a cap layer 210 may be formed on the dielectric layer 206. In the present embodiment, the cap layer 210 is a silicon nitride layer, but the present invention is not limited thereto. The cap layer 210 is optional, that is, the cap layer 210 may be omitted according to actual needs. After that, conductive vias 212 may be formed in the dielectric layer 206 and the cap layer 210. The cap layer 210 exposes the top surfaces of the conductive vias 212. The conductive vias 212 are similar to the conductive vias 112, and thus the conductive vias 212 are not further described here.

Figure 1G:
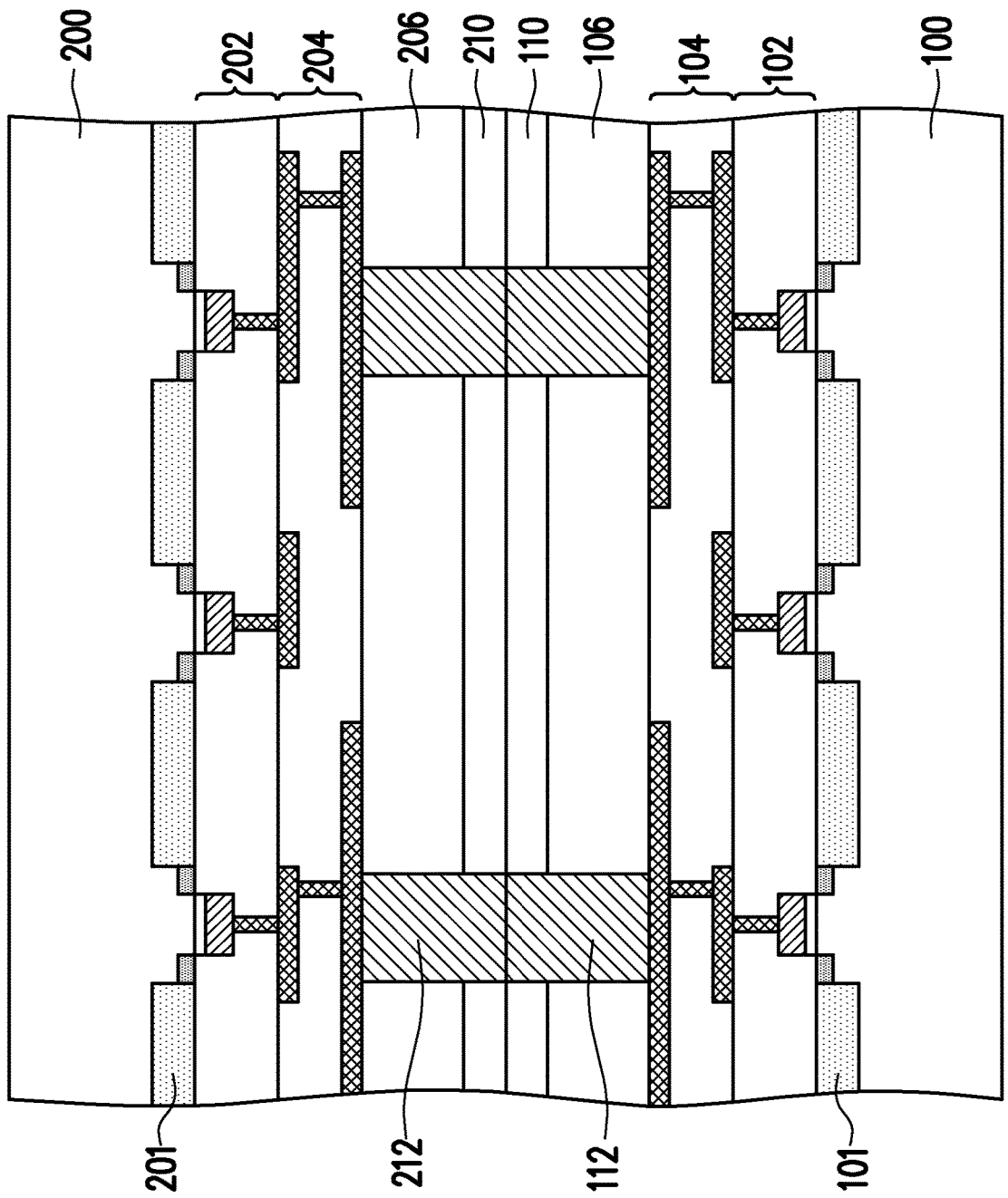

Referring to FIG. 1G, the substrate 100 and the substrate 200 are bonded with the dielectric layer 106 facing the dielectric layer 206, and the conductive vias 112 and the conductive vias 212 are connected to each other. In this way, the fabrication of the semiconductor structure of the present embodiment is completed. In the present embodiment, the method for bonding substrate 100 and substrate 200 is, for example, a lamination process. After the substrate 100 and the substrate 200 are laminated, a heat treatment may be performed at a temperature of, for example, 350° C. for about 2 hours.

In the manufacturing process of the semiconductor structure of the present embodiment, before the conductive vias 112 and the conductive vias 212 are formed, the dielectric layer 106 and the dielectric layer 206 are subjected to a heat treatment with a temperature between 300° C. and 400° C. Through the heat treatment, the structures of the dielectric layer 106 and the dielectric layer 206 may be strengthened to have higher stability. In this way, the dielectric layer 106 and the dielectric layer 206 may not be warped over time, so that the conductive vias 112 and the conductive vias 212 may be precisely aligned.

In addition, in the present embodiment, since the dielectric layer 106 and the dielectric layer 206 may not be warped over time, the formed semiconductor structure may not have the problem of film peeling due to the warpage of the dielectric layer 106 and the dielectric layer 206, which increases the bonding strength between substrate 100 and substrate 200.

In addition, after the above heat treatment, the components of the dielectric layer 106 and the dielectric layer 206 may not be easily reacted in subsequent processes, and thus the stability of the dielectric layer 106 and the dielectric layer 206 may not be affected.

It will be apparent to those skilled in the art that various modifications and variations may be made to the disclosed embodiments without departing from the scope or spirit of the invention. In view of the foregoing, it is intended that the invention covers modifications and variations provided that they fall within the scope of the following claims and their equivalents.

What is claimed is:

1. A manufacturing method of a semiconductor structure, comprising:
   forming a first dielectric layer on a first substrate;
   forming a second dielectric layer on a second substrate;
   performing a first heat treatment on the first dielectric layer and the second dielectric layer, wherein a temperature of the first heat treatment is between 300° C. and 400° C.;
   forming a first conductive via in the first dielectric layer;
   forming a second conductive via in the second dielectric layer; and
   bonding the first substrate and the second substrate in a manner that the first dielectric layer faces the second dielectric layer, so as to connect the first conductive via and the second conductive via,
   wherein the first heat treatment is performed after forming the first dielectric layer and the second dielectric layer and before forming the first conductive via and the second conductive via.

2. The manufacturing method of claim 1, wherein the first heat treatment is performed in a nitrogen or oxygen atmosphere.

3. The manufacturing method of claim 1, wherein a time of the first heat treatment is between 0.5 hours and 2 hours.

4. The manufacturing method of claim 1, wherein the first dielectric layer and the second dielectric layer are independently subjected to the first thermal treatment.

5. The manufacturing method of claim 1, wherein a thickness of the first dielectric layer is 5000 Å or more.

6. The manufacturing method of claim 1, wherein a method for forming the first dielectric layer comprises a plasma enhanced chemical vapor deposition process.

7. The manufacturing method of claim 1, wherein a thickness of the second dielectric layer is 5000 Å or more.

8. The manufacturing method of claim 1, wherein a method for forming the second dielectric layer comprises a plasma enhanced chemical vapor deposition process.

9. The manufacturing method of claim 1, further comprising forming a cap layer on the first dielectric layer after forming the first dielectric layer, wherein the cap layer exposes a top surface of the first conductive via.

10. The manufacturing method of claim 1, further comprising forming a cap layer on the second dielectric layer after forming the second dielectric layer, wherein the cap layer exposes a top surface of the second conductive via.

11. The manufacturing method of claim 1, further comprising performing a second heat treatment after forming the first conductive via and before bonding the first substrate and the second substrate, wherein a temperature of the second heat treatment is lower than 300° C.

12. The manufacturing method of claim 1, further comprising performing a second heat treatment after forming the second conductive via and before bonding the first substrate and the second substrate, wherein a temperature of the second heat treatment is lower than 300° C.

\* \* \* \* \*